United States Patent
Bongale et al.

(10) Patent No.: US 10,606,723 B2
(45) Date of Patent: Mar. 31, 2020

(54) SYSTEMS AND METHODS FOR OPTIMAL TRIM CALIBRATIONS IN INTEGRATED CIRCUITS

(71) Applicant: TEXAS INSTRUMENTS INCORPORATED, Dallas, TX (US)

(72) Inventors: Pankaj Bongale, Belgaum (IN); Partha Ghosh, West Bengal (IN); Rubin Ajit Parekhji, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 13 days.

(21) Appl. No.: 14/975,193

(22) Filed: Dec. 18, 2015

(65) Prior Publication Data
US 2017/0177456 A1    Jun. 22, 2017

(51) Int. Cl.
| | | |
|---|---|---|
| G06F 11/00 | (2006.01) | |
| G06F 11/263 | (2006.01) | |
| G06F 11/24 | (2006.01) | |
| G01R 31/28 | (2006.01) | |
| G06F 11/22 | (2006.01) | |
| G06F 11/273 | (2006.01) | |

(52) U.S. Cl.
CPC ........ *G06F 11/263* (2013.01); *G01R 31/2822* (2013.01); *G06F 11/2268* (2013.01); *G06F 11/24* (2013.01); *G06F 11/273* (2013.01)

(58) Field of Classification Search
CPC .. G06F 11/263; G06F 11/2268; G06F 11/273; G01R 31/3187; G01R 31/3193
See application file for complete search history.

(56) References Cited

U.S. PATENT DOCUMENTS

| | | | |
|---|---|---|---|
| 5,642,116 A * | 6/1997 | Gersbach | H03M 1/1052 341/120 |
| 6,236,286 B1 * | 5/2001 | Hoffmann | H03F 1/3229 330/149 |
| 6,338,032 B1 * | 1/2002 | Chen | H03F 3/45968 327/564 |
| 7,002,496 B2 | 2/2006 | Kuyel | |
| 7,688,240 B2 | 3/2010 | Jain et al. | |
| 7,761,818 B2 | 7/2010 | Gray et al. | |

(Continued)

OTHER PUBLICATIONS

International Search Report for PCT/US2016/067501 dated Mar. 30, 2017.

*Primary Examiner* — Philip Guyton
(74) *Attorney, Agent, or Firm* — Michelle F. Murray; Charles A. Brill; Frank D. Cimino

(57) ABSTRACT

A test circuit that includes a circuit to be calibrated, an error generation circuit, and a simplex circuit coupled to one another. The circuit to be calibrated is configured to implement a first plurality of trim codes as calibration parameters for a corresponding plurality of components of the circuit to be calibrated and generate a first actual output. The error generation circuit is configured to generate a first error signal based on a difference between the first actual output and an expected output of the circuit to be calibrated. The simplex circuit is configured to receive the first error signal from the error generation circuit, generate a second plurality of trim codes utilizing a simplex algorithm based on the first error signal, and transmit the second plurality of trim codes to the circuit to be calibrated.

20 Claims, 3 Drawing Sheets

(56) References Cited

U.S. PATENT DOCUMENTS

| | | | | |
|---|---|---|---|---|
| 8,929,158 B1* | 1/2015 | Wang | ................ | G11C 5/147 |
| | | | | 365/185.24 |
| 8,972,807 B2 | 3/2015 | Mittal et al. | | |
| 9,356,590 B1* | 5/2016 | da Silva, Jr. | ............ | G05F 3/08 |
| 2008/0281544 A1* | 11/2008 | Huang | ................ | H04N 17/00 |
| | | | | 702/107 |
| 2013/0169369 A1* | 7/2013 | Turner | ............ | H03K 3/02315 |
| | | | | 331/25 |

* cited by examiner

SYSTEMS AND METHODS FOR OPTIMAL TRIM CALIBRATIONS IN INTEGRATED CIRCUITS

BACKGROUND

Many circuits (i.e., analog, radio frequency (RF), and/or mixed signal circuits) require fine tuning of various components (e.g., resistors, capacitors, delay lines, transistor biasing, etc.) to meet specifications. The process of fine tuning these components may be termed trimming. While the circuit is being trimmed, different trim codes are read into the circuit and applied to their corresponding components. These trim codes are specific calibration parameters for their corresponding components. Each possible trim code for each component is then applied to their respective components until the circuit meets its specifications. Many times, this calibration process involves tuning of multiple inter-dependent trim codes to generate the desired output. This may require the designer/test engineer to perform a complicated sequence of optimizations that include repeatedly tuning different trim codes one at a time. Additionally, because the optimization of a second component may alter the optimization of the first component, an overall optimal trim code combination may be difficult to achieve.

SUMMARY

The problems noted above are solved in large part by systems and methods for calibrating a circuit. In some embodiments, a test circuit includes a circuit to be calibrated, an error generation circuit, and a simplex circuit coupled to one another. The circuit to be calibrated is configured to implement a first plurality of trim codes as calibration parameters for a corresponding plurality of components of the circuit and generate a first actual output. The error generation circuit is configured to generate a first error signal based on a difference between the first actual output and an expected output of the circuit. The simplex circuit is configured to receive the first error signal from the error generation circuit, generate a second plurality of trim codes utilizing a simplex algorithm based on the first error signal, and transmit the second plurality of trim codes to the circuit to be calibrated.

Another illustrative embodiment is a method for calibrating a circuit. The method may comprise generating a first plurality of error signals based on differences between a plurality of expected outputs from a circuit to be calibrated and a plurality of actual outputs from the circuit to be calibrated implementing a first plurality of trim codes. The method may also comprise generating a first simplex structure comprising a plurality of vertices corresponding to the first plurality of trim codes. The method may also comprise calculating a centroid of the first simplex structure. The method may also comprise transforming a first vertex of the first plurality of vertices to generate a second plurality of trim codes. The method may also comprise transmitting the second plurality of trim codes to the circuit to be calibrated for implementation.

Yet another illustrative embodiment is a simplex circuit. The simplex circuit may comprise ordering logic, centroid calculation logic, and transformation logic. The ordering logic may be configured to receive a first plurality of error signals and generate a first simplex structure comprising a first plurality of vertices. Each of the first plurality of error signals are generated based on differences between a plurality of expected outputs from a circuit to be calibrated and a plurality of actual outputs from the circuit to be calibrated implementing a first plurality of trim codes. Each of the first plurality of vertices corresponds with one of the first plurality of trim codes. The centroid calculation logic is configured to identify a centroid of the first simplex structure. The transformation logic is configured to reflect, expand, contract, or reduce a first vertex of the first plurality of vertices to generate a second plurality of trim codes. The transformation logic is also configured to transmit the second plurality of trim codes to the circuit to be calibrated for implementation.

BRIEF DESCRIPTION OF THE DRAWINGS

For a detailed description of various examples, reference will now be made to the accompanying drawings in which.

NOTATION AND NOMENCLATURE

Figure 1:
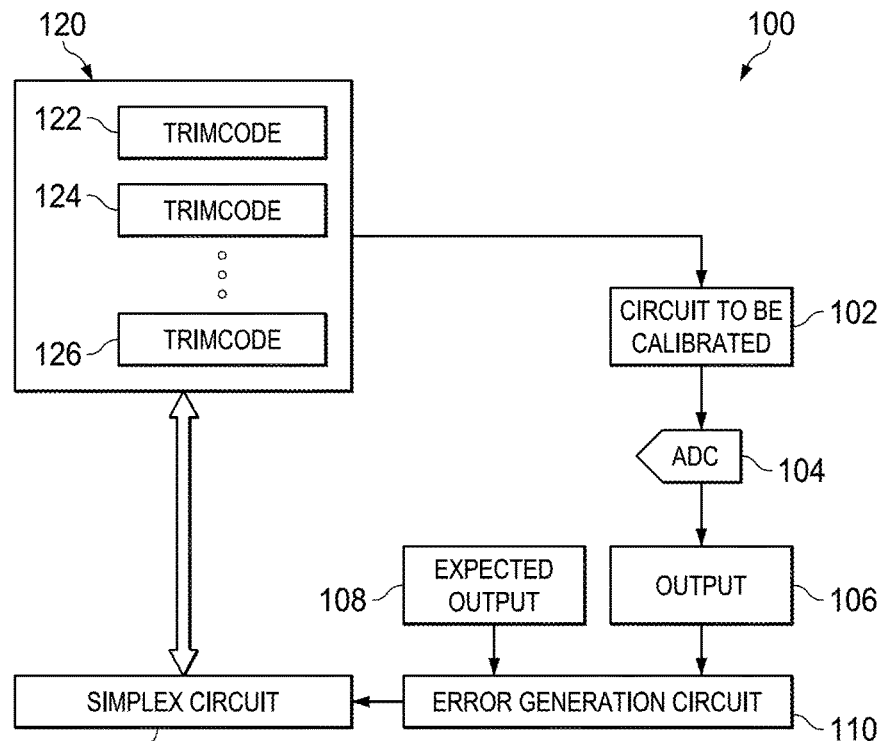
FIG. 1 shows a block diagram of a test circuit in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Many circuits require trimming for optimization and/or to meet specifications. Thus, these circuits require calibration of various components. A component in a circuit is any sub-part of the circuit whose parametric value can be changed for tuning/controlling the circuit's operation. Examples are resistors, capacitors, delay lines, transistors (transistor biasing), etc. While the circuit is being trimmed, different trim codes are read into the circuit and applied to their corresponding components. These trim codes are specific calibration parameters for their corresponding components. In a conventional system, each possible trim code for each component is then applied to their respective components until the circuit meets its specifications. Many times in the conventional system, this calibration process involves tuning of multiple inter-dependent trim codes to generate the desired output corresponding to the specification being required to be met by the circuit. This may require the designer/test engineer to perform a complicated sequence of optimizations that include repeatedly tuning different trim codes one at a time. In fact, because the optimization of one component may have an effect on another component, even after a first component is optimized, it may need to be re-optimized after a second component is optimized. Additionally, because the optimization of a second component may alter the optimization of the first component, an overall optimal trim code combination may be difficult to achieve. Thus, it is desirable to create a fast technique for multi-dimensional trim code optimization that calibrates multiple trim codes simultaneously.

FIG. 1 shows a block diagram of a test circuit 100 in accordance with various embodiments. The test circuit 100 may include circuit to be calibrated 102, analog-to-digital converter (ADC) 104, error generation logic 110, and simplex circuit 112. Circuit to be calibrated 102 may include any type of circuit that is configured to implement multiple trim codes as calibration parameters for corresponding components, such as resistors, capacitors, etc. In other words, circuit to be calibrated 102 may be configured such that some of the components included in the circuit are capable of being calibrated. For example, the resistance of a resistor and/or the capacitance of a capacitor in the circuit to be calibrated 102 may be configurable. In some embodiments, in order to optimize the performance of circuit to be calibrated 102 and/or to meet specifications set for the circuit to be calibrated 102, these parameters may be fine-tuned (i.e., the values of the parameters for the corresponding components may be changed to optimize and/or meet performance specifications).

Simplex circuit 112 may be a hardware circuit that is configured to generate multiple trim codes simultaneously, such as trim codes 122-126 that may make up trim code family 120. The ellipsis between the trim codes 124 and 126 indicates that the trim code family 120 may include any suitable number of trim codes, although, for clarity, only two are shown. Each trim code 122-126 may include a calibration parameter for a specific component within circuit to be calibrated 102. Thus, trim code 122 may be representative of a calibration parameter (e.g., a resistance or capacitance) for a specific component (e.g., a resistor or capacitor) in the circuit to be calibrated 102. Similarly, trim code 124 may be representative of a calibration parameter for a different specific component than the trim code 122 in circuit to be calibrated 102. For example, trim code 122 may be representative of a resistance of a resistor in the circuit to be calibrated 102 while trim code 124 may be representative of a capacitance for a capacitor in the circuit to be calibrated 102.

In an embodiment, in a first iteration, simplex circuit 112 may generate random trim codes 122-126 that make up trim code family 120. This initial set of trim codes 122-126 are set in their respective registers of the testing circuit 100. Circuit to be calibrated 102 then may read the initial trim codes 122-126 and apply those parameters to their corresponding components. For example, the value of the trim code 122 may be read into the circuit to be calibrated 102. If that value is representative of the resistance of a resistor in the circuit to be calibrated 102, then the circuit to be calibrated 102 will set that resistor to the resistance called for by trim code 122. Similarly, if the value of the trim code 124 is representative of the capacitance of a capacitor in the circuit to be calibrated 102, then the circuit to be calibrated 102 will read the trim code 124 and set the capacitor to the capacitance called for by trim code 124.

After the parameters called for by the trim codes 122-126 are applied, the circuit to be calibrated 102 may produce various outputs. For example, the circuit to be calibrated 102 may produce an output signal due to the implementation of each of the trim codes 122-126. This output signal or signals may correspond to two alternatives which may be applicable: (i) two or more trim codes controlling a single output; or (ii) two or more trim codes controlling two or more outputs. Thus, in an embodiment, one output signal may correspond with an output of a first component of circuit to be calibrated 102 while a second output signal may correspond with an output for a second component of circuit to be calibrated 102. We may have to put this in the appropriate place with suitable re-wording. In some embodiments, ADC 104, which may be any type of ADC, converts these output signals, which in an embodiment are analog (i.e., a continuous time and continuous amplitude signal) into digital output signals. In alternative embodiments, ADC 104 is not required and the output signals from the circuit to be calibrated 102 need not be converted (i.e., because those signals are already digital signals). These output signals, whether converted by ADC 104 or not, may be termed actual output 106 which is received by error generation circuit 110. Expected output 108 is also received by the error generation logic 110. The expected output 108 may be any predefined output that a user desires the circuit to be calibrated 102 to produce in operation. For example, the expected output 108 may be an optimal output and/or an output that meets specifications for the circuit to be calibrated 102. Additionally, the expected output 108, like the actual output 106, may include multiple outputs. Therefore, the expected output 108 may be comprised of an expected output for the first component of circuit to be calibrated 102 and an expected output for a second component of circuit to be calibrated 102.

The error generation logic 110 receives both the actual output 106 and the expected output 108. The error generation logic 110 may be any hardware that is configured to generate an error signal based on the difference between the actual output 106 and the expected output 108. In some embodiments, a single error value is generated by error generation circuit 110. If only a single actual output 106 and single expected output 108 are received by error generation logic 110, then error generation logic 110 may subtract the actual output 106 from the expected output to generate the error value. However, if multiple actual outputs 106 and multiple expected outputs 108 are received by error generation logic 110 at once, then error generation logic 110 generates an error value that is representative of all of the outputs. For example, $e_1$ may represent an error value for the actual output of a first component while $e_2$ represents an error value for the actual output of a second component. These may be determined by error generation logic 110 as follows:

$$e_1 = \text{output}_{exp1} - \text{output}_{actual1} \quad e_2 = \text{output}_{exp2} - \text{output}_{actual2}$$

where $\text{output}_{exp1}$ is the expected output value for the first component, $\text{output}_{actual1}$ is the actual output value for the first component, $\text{output}_{exp2}$ is the expected output value for the second component, and $\text{output}_{actual2}$ is the actual output value for the second component. Because the error values $e_1$ and $e_2$ may be caused by different component types (e.g., resistors, capacitors, etc.), the resulting error values may be based on different units of measurement. Thus, the error values $e_1$ and $e_2$ may be normalized. Furthermore, a user may consider the output of one component to be more important than the output of a second component. Therefore, the error values $e_1$ and $e_2$ may also be weighted, so that the single error value generated by error generation circuit 110 represents an overall error of the circuit to be calibrated 108. This single error value may be determined by error generation logic 110 as follows:

$$e_{eff} = \sqrt{w_1(n_1 e_1)^2 + w_2(n_2 e_2)^2 + \ldots}$$

where $e_{eff}$ is the single error value, $w_1$ is the weight factor for the first error value, $n_1$ is the normalization factor for the first error value, $w_2$ is the weight factor for the second error value, and $n_2$ is the normalization factor for the second error value. An error signal representative of the single error value than may be transmitted to the simplex circuit 112 as a function $f$. The simplex circuit 112 may compare the error value contained in the error signal with a threshold value. If the error value is less than the threshold value, then the simplex circuit 112 identifies the trim codes of trim code family 120 as the calibrated trim codes for the circuit to be calibrated 102. The threshold value, in an embodiment, is based on an optimized output and/or an output that meets specifications. Thus, if the error value is less than the threshold value, the trim codes in trim code family 120 provide sufficient optimization and/or meet specifications for the circuit to be calibrated 102, that those trim codes may be utilized in circuit to be calibrated 102 and the calibration routine may end.

However, in the event that that the error value exceeds the threshold value, in an embodiment, the simplex circuit 112 may generate multiple additional random and/or uncorrelated trim codes as trim code families. Each trim code family is then implemented by the circuit to be calibrated 102, and an error signal is generated by error generation logic 110 as discussed above for each of the trim code families implemented by the circuit to be calibrated 102. Additionally, the simplex circuit 112 may compare each of the error values of the error signals with the threshold value to determine whether the calibrated trim codes have randomly been generated. However, if the threshold value is exceeded in each of the randomly generated trim code family implementations, then a simplex algorithm may be performed to optimize the trim codes. In an embodiment, the simplex circuit 112 generates three sets of random trim code families, and thus, the simplex circuit 112 receives three error signals $f$ from the error generation circuit 110 prior to the simplex circuit 112 implementing a simplex algorithm to optimize the trim codes generated. In alternative embodiments, two or more random sets of trim code families are generated by simplex circuit 112 prior to the simplex algorithm being implemented by the simplex circuit 112. In some embodiments, the error value contained in the error signal is not compared with the threshold value until all of the error signals corresponding to the randomly generated trim codes are generated by error generation logic 110. For example, the simplex circuit 112 may only compare the error values contained in the error signal once the error generation logic 110 has generated error signals for each of three randomly generated trim code families. The simplex circuit then may compare the error values for each of the error signals to the threshold value to determine if any of the three trim code families comprise the calibrated trim codes.

Figure 2:
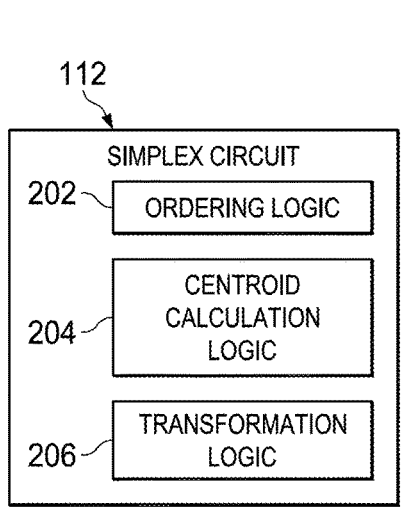
FIG. 2 shows a block diagram of a simplex circuit in accordance with various embodiments.

FIG. 2 shows a block diagram of simplex circuit 112 in accordance with various embodiments. Simplex circuit 112 may include ordering logic 202, centroid calculation logic 204, and transformation logic 206. Ordering logic 202, which may be any type of hardware, may receive the error signals $f$ generated by the error generation logic 110 corresponding to the actual outputs 106 generated by circuit to be calibrated 102 due to the randomly generated trim codes. The ordering logic 202 may be configured to arrange each of these error signals $f$ in an order where the best error signal (i.e., error signal where the error value is the least) and/or the worst error signal (i.e., error signal where the error value is the greatest) are able to be determined.

Additionally, the ordering logic 202 may be configured to generate a simplex structure utilizing the randomly generated trim codes as vertices. For example, if trim code family 120 contains two trim codes 122 and 124, trim code 122 may make up the x-coordinate of a vertex $x_1$ of the simplex structure while the trim code 124 may make up the y-coordinate of the same vertex $y_1$ of the simplex structure. Thus, the error signal for the actual output 108 caused by trim codes 122 and 124 is $f(x_1, y_1)$. If three sets of random trim codes are initially received by ordering logic 202, then the three vertices of the simplex structure are:

$$(x_1, y_1), (x_2, y_2), (x_3, y_3)$$

where $x_2$ is the second random trim code for the same component as $x_1$, $y_2$ is the second random trim code for the same component as $y_1$, $x_3$ is the third random trim code for the same component as $x_1$, and $y_3$ is the third random trim code for the same component as $y_1$. The corresponding error signals are, thus, represented by the functions:

$$f(x_1, y_1), f(x_2, y_2), f(x_3, y_3)$$

In this example, ordering logic 202 may arrange the vertices $(x_1, y_1)$, $(x_2, y_2)$, $(x_3, y_3)$ with respect to their function values $f(x_1, y_1)$, $f(x_2, y_2)$, $f(x_3, y_3)$ in order from the best error signal to the worst error signal. Because two trim codes are represented in this example, the vertices of the simplex structure are in two dimensional space. In alternative examples, where more than two trim codes are implemented in the circuit to be calibrated 102 at a time (e.g., n trim codes), the simplex structure may be represented in the number of trim codes implemented dimensional space (e.g., n-dimensional space). In other words, the simplex structure for n trim codes may be represented in n-dimensional space.

Centroid calculation logic 204 may be hardware configured to calculate the centroid of the simplex structure minus the vertex corresponding to the worst error signal (i.e., the geometric center of a simplex structure that has all of the vertices arranged by ordering logic 202 except for the vertex corresponding to the worst error signal). For example, centroid calculation logic 204 may be configured to calculate the centroid of the simplex structure formed by the vertices $(x_1, y_1)$, $(x_2, y_2)$, $(x_3, y_3)$, where $(x_1, y_1)$ corresponds to the vertex corresponding to the best error signal and $(x_3, y_3)$ corresponds to the vertex corresponding to the worst error signal, by determining the geometric center of the simplex structure formed by $(x_1, y_1)$ and $(x_2, y_2)$.

The transformation logic 206 may be any hardware that is configured to reflect, expand, contract, and/or reduce one or more of the vertices of the simplex structure in order to generate an additional trim code family. The transformation logic 206 then may transmit the generated trim code family to the circuit to be calibrated 102 for implementation by the circuit to be calibrated 102.

More particularly, transformation logic 206 may be configured to reflect the vertex of the simplex structure corresponding to the worst error signal. For example, if the ordering logic 202 has arranged $f(x_3, y_3)$ as the worst error signal, then the vertex $(x_3, y_3)$ is reflected because it is known that points closer to $(x_1, y_1)$ and $(x_2, y_2)$ have a better error signal than $(x_3, y_3)$. In an embodiment, the vertex corresponding to the worst error signal is reflected linearly along the centroid. For example, the point where the vertex with the worst error signal (e.g., $(x_3, y_3)$) is reflected may be determined as follows:

$$(x_{r1}, y_{r1}) = (x_0 + \alpha(x_0 - x_3)), (y_0 + \alpha(y_0 - y_3))$$

where $(x_{r1}, y_{r1})$ is the point where the vertex is to be reflected linearly along the centroid, $x_0$ is the x-coordinate of the centroid, $y_0$ is the y-coordinate of the centroid, and $\alpha$ is a multiplication factor of the reflection. In some examples, $\alpha$ is a predetermined multiplication factor that is preprogrammed into the transformation logic 206 (e.g., 1).

Figure 3:
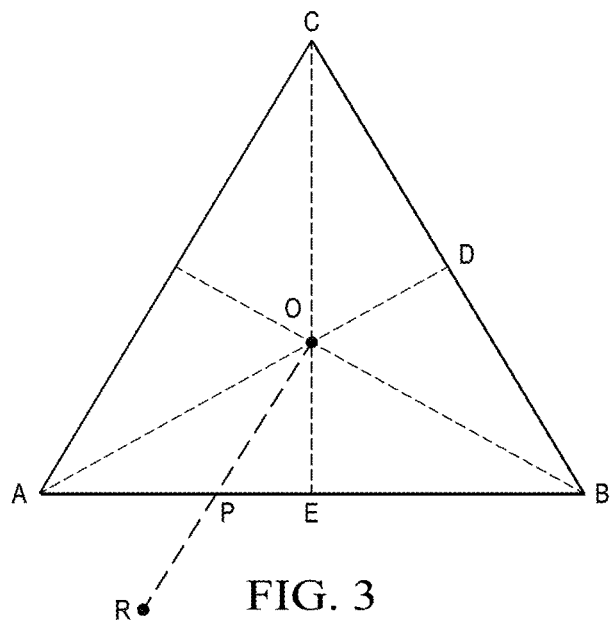
FIG. 3 shows an example simplex structure in accordance with various embodiments.

In an alternative embodiment, transformation logic 206 may be configured to reflect the vertex of the simplex structure corresponding to the worst error signal in a direction of local slope of the first simplex structure. For example, as shown in FIG. 3 which is an example simplex structure in accordance with various embodiments, a three dimensional structure may be defined by vertices at: $(x_1, y_1, f(x_1, y_1))$ (vertex A), $(x_2, y_2, f(x_2, y_2))$ (vertex B), and $(x_3, y_3, f(x_3, y_3))$ (vertex C) with the function value $f$ plotted along z-axis. The normal to the plane defined by ABC is defined by $\vec{AB} \times \vec{AC}$. Furthermore, $$\vec{AB} = (x_2 - x_1)\hat{i} + (y_2 - y_1)\hat{j} + (f_2 - f_1)\hat{k}$$
$$\vec{AC} = (x_3 - x_1)\hat{i} + (y_3 - y_1)\hat{j} + (f_3 - f_1)\hat{k}$$

$$\vec{AB} \times \vec{AC} = \begin{bmatrix} \hat{i} & \hat{j} & \hat{k} \\ (x_2 - x_1) & (y_2 - y_1) & (f_2 - f_1) \\ (x_3 - x_1) & (y_3 - y_1) & (f_3 - f_1) \end{bmatrix}$$

$$= [(y_2 - y_1)(f_3 - f_1) - (y_3 - y_1)(f_2 - f_1)]\hat{i} -$$
$$[(x_2 - x_1)(f_3 - f_1) - (x_3 - x_1)(f_2 - f_1)]\hat{j} +$$
$$[(x_2 - x_1)(y_3 - y_1) - (x_3 - x_1)(y_2 - y_1)]\hat{k}.$$

Hence, the equation of the plane ABC is:

$$[(y_2-y_1)(f_3-f_1)-(y_3-y_1)(f_2-f_1)]x - [(x_2-x_1)(f_3-f_1)-(x_3-x_1)(f_2-f_1)]y + [(x_2-x_1)(y_3-y_1)-(x_3-x_1)(y_2-y_1)]f(x,y) = c.$$

This allows the expression for $f$ to be determined as:

$$f(x, y) = \frac{c - [(y_2 - y_1)(f_3 - f_1) - (y_3 - y_1)(f_2 - f_1)]x + [(x_2 - x_1)(f_3 - f_1) - (x_3 - x_1)(f_2 - f_1)]y}{[(x_2 - x_1)(y_3 - y_1) - (x_3 - x_1)(y_2 - y_1)]}$$

Calculating the gradient of $f(x, y)$ gives the vector pointing in the direction of local slope as:

$$\nabla f(x, y) = (\nabla f_x, \nabla f_y)$$
$$= \left(\frac{\partial f}{\partial x}, \frac{\partial f}{\partial y}\right)$$
$$= \left(\frac{[(y_3 - y_1)(f_2 - f_1) - (y_2 - y_1)(f_3 - f_1)]}{[(x_2 - x_1)(y_3 - y_1) - (x_3 - x_1)(y_2 - y_1)]}, \frac{[(x_2 - x_1)(f_3 - f_1) - (x_3 - x_1)(f_2 - f_1)]}{[(x_2 - x_1)(y_3 - y_1) - (x_3 - x_1)(y_2 - y_1)]}\right).$$

If $k = [(x_2 - x_1)(y_3 - y_1) - (x_3 - x_1)(y_2 - y_1)]$, then:

$$(k\nabla f_x, k\nabla f_y) = ([(y_3 - y_1)(f_2 - f_1) - (y_2 - y_1)(f_3 - f_1)], [(x_2 - x_1)(f_3 - f_1) - (x_3 - x_1)(f_2 - f_1)])$$

Since in this example, $f(x_1, y_1) < f(x_2, y_2) < f(x_3, y_3)$ (i.e., $(x_3, y_3)$ is the worst error signal and $f(x_1, y_1)$ is the best error signal), $-\nabla f$ makes an angle between unit vectors $\vec{u_{0A}}$ (the unit vector between the centroid 0 (the centroid 0 being the geometric center of the simplex structure formed by all of the vertices A, B, C of the simplex structure) and the vertex A) and $\vec{u_{0E}}$ (the unit vector between the centroid 0 and the mid-point between vertexes A and B (E)). The reflection of the centroid of the triangle 0 along $-\nabla f$ intersects AB between $\vec{u_{0A}}$ and $\vec{u_{0E}}$.

To find the point of intersection $P(x_p, y_p)$ of $-\nabla f$ on AB:

$$y = y_O + \frac{\nabla f_y}{\nabla f_x}(x - x_O) \qquad \text{Equation of } \vec{OR}$$

$$y = y_1 + \frac{y_2 - y_1}{x_2 - x_1}(x - x_1) \qquad \text{Equation of } \vec{AB}$$

$$(x_P, y_P) = \left(\frac{(y_1 - y_O) + \frac{\nabla f_y}{\nabla f_x}x_O - \frac{y_2 - y_1}{x_2 - x_1}x_1}{\frac{\nabla f_y}{\nabla f_x} - \frac{y_2 - y_1}{x_2 - x_1}}, \frac{\frac{\nabla f_y}{\nabla f_x}y_1 - \frac{y_2 - y_1}{x_2 - x_1}(y_O + x_1 - x_O)}{\frac{\nabla f_y}{\nabla f_x} - \frac{y_2 - y_1}{x_2 - x_1}}\right)$$

The vertices of the new centroid along $-\nabla f$ across line AB is given by:

$$(x_{O_r}, y_{O_r}) = (x_p + (x_p - x_0), y_p + (y_p - x_0)).$$

From this, the vertices of the reflection point R are calculated as:

$$(x_{r2}, y_{r2}) = (3x_{O_r} - x_1 - x_2, 3y_{O_r} - x_1 - x_2)$$
$$= (6x_p - 2x_1 - 2x_2 - x_3, 6y_p - 2y_1 - 2y_2 - y_3)$$
$$= \left(\frac{2\nabla f_x(x_2 - x_1)(2y_1 - y_2 - y_3) + 2\nabla f_y(x_2 - x_1)(x_1 + x_2 + x_3) - \frac{6\nabla f_x x_1(y_2 - y_1)}{\nabla f_y(x_2 - x_1) - \nabla f_x(y_2 - y_1)} - 2x_1 - 2x_2 - x_3}{}, \frac{6\nabla f_y(x_2 - x_1)y_1 + 2\nabla f_x(2x_1 - x_2 - x_3 + y_1 + y_2 + y_3)}{\nabla f_y(x_2 - x_1) - \nabla f_x(y_2 - y_1)} - 2y_1 - 2y_2 - y_3\right)$$

In this way, the transformation logic 206 may reflect the vertex of the simplex structure corresponding to the worst error signal in a direction of local slope of the first simplex structure to create a new simplex structure. As discussed previously, while only two dimensions are shown in this example, the reflection point may extend to and be calculated from any number of dimensions. For example, the reflection point could be represented by $(x_{r2}, y_{r2}, z_{r2})$ and calculated in a similar manner as noted for the two dimensional $(x_{r2}, y_{r2})$.

Because the vertices of new simplex structure, utilizing $(x_{r2}, y_{r2})$ as one of the vertices, may be close to a linear arrangement which might hinder further transformations, if the slope of the newly calculated vertex is less than a threshold value to the slope of one of the sides of the new simplex structure (the slope comparison value), the transformation logic 206 may not, in an embodiment, use $(x_{r2}, y_{r2})$ as the reflection point, but instead may use $(x_{r1}, y_{r1})$ as calculated above. More specifically, transformation logic 206, in an embodiment, may determine the reflection point $(x_r, y_r)$ as:

$$(x_r, y_r) = \begin{cases} (x_{r1}, y_{r1}), & \tan^{-1}\left|\frac{m_1 - m_2}{1 + m_1 m_2}\right| < \theta_{thresh} \\ (x_{r2}, y_{r2}), & \tan^{-1}\left|\frac{m_1 - m_2}{1 + m_1 m_2}\right| \geq \theta_{thresh} \end{cases}$$

where $\theta$ is the slope comparison value.

If the reflection point $(x_r, y_r)$ corresponds to trim codes that produce an error signal that is not the best error signal, but is not the worst error signal, such that $f(x_1, y_1) < f(x_r, y_r) < f(x_3, y_3)$. The reflection point $(x_r, y_r)$ replaces the worst point $(x_3, y_3)$ and provides the new point that ordering logic arranges from best to worst or worst to best. For example, the reflection point $(x_r, y_r)$ provides the trim codes that may be implemented by circuit to be calibrated 102 (e.g., $x_r$ being the trim code for the first component and $y_r$ being the trim code for the second component). The test circuit 100 then repeats the process of generating another actual output 108, generating another error signal, determining whether the new trim codes are the calibrated trim codes, and if the new trim codes are not the calibrated trim codes, arranging the error signals from best to worst or worst to best.

If the reflection point $(x_r, y_r)$ corresponds to trim codes that produce the best error signal of all previous error signals, such that $f(x_r, y_r) < f(x_1, y_1) < f(x_2, y_2) < f(x_3, y_3)$, then the reflection produced trim codes that produces an actual output 106 closer to the expected output 108. Thus, in an embodiment, the transformation logic 206 may expand the reflected point to move the reflected point further in the same direction. In an embodiment, the reflected point $(x_r, y_r)$ is expanded linearly along the centroid as follows:

$$(x_{e1}, y_{e1}) = (x_0 + \beta(x_0 - x_3)), (y_0 + \beta(y_0 - y_3))$$

where $(x_{e1}, y_{e1})$ is the point where the reflected vertex is to be expanded linearly along the centroid, $x_0$ is the x-coordinate of the centroid, $y_0$ is the y-coordinate of the centroid, and $\beta$ is a multiplication factor of the expansion. In some examples, $\beta$ is a predetermined multiplication factor that is preprogrammed into the transformation logic 206 that is larger than the multiplication factor $\alpha$ (e.g., 2). In an alternative embodiment, transformation logic 206 may be configured to expand the reflected vertex $(x_r, y_r)$ in a direction of local slope of the first simplex structure. Similar, to the reflection created by $(x_{r2}, y_{r2})$ above, the expansion in the direction of the local slope of the first simplex structure may be determined as follows:

$$(x_{e2}, y_{e2}) = \begin{pmatrix} 3\nabla f_x(x_2 - x_1)(2y_1 - y_2 - y_3) + \\ 3\nabla f_y(x_2 - x_1)(x_1 + x_2 + x_3) - \\ \frac{9\nabla f_x x_1(y_2 - y_1)}{\nabla f_y(x_2 - x_1) - \nabla f_x(y_2 - y_1)} - 3x_1 - 3x_2 - 2x_3, \\ 9\nabla f_y(x_2 - x_1)y_1 + 3\nabla f_x \\ \frac{(2x_1 - x_2 - x_3 + y_1 + y_2 + y_3)(y_2 - y_1)}{\nabla f_y(x_2 - x_1) - \nabla f_x(y_2 - y_1)} - 3y_1 - 3y_2 - 2y_3 \end{pmatrix}.$$

As discussed previously, while only two dimensions are shown in this example, the expansion point may extend to and be calculated from any number of dimensions. For example, the expansion point could be represented by $(x_{e2}, y_{e2}, z_{e2})$ and calculated in a similar manner as noted for the two dimensional $(x_{e2}, y_{e2})$. Because the vertices of new simplex structure, utilizing $(x_{e2}, y_{e2})$ as one of the vertices, may be close to a linear arrangement which might hinder further transformations, if the slope of the newly calculated vertex is less than a threshold value to the slope of one of the sides of the new simplex structure (the slope comparison value), the transformation logic 206 may not, in an embodiment, use $(x_{e2}, y_{e2})$ as the expansion point, but instead may use $(x_{e1}, y_{e1})$ as calculated above. The slope comparison value may be a relationship between the slope of a line from one of the vertices of the simplex structure to the second vertex and the slope of another of the sides of the new simplex structure. Thus, transformation logic 206, in an embodiment, may determine the expansion point $(x_e, y_e)$ as:

$$(x_e, y_e) = \begin{cases} (x_{e1}, y_{e1}), & \tan^{-1}\left|\frac{m_1 - m_2}{1 + m_1 m_2}\right| < \theta_{thresh} \\ (x_{e2}, y_{e2}), & \tan^{-1}\left|\frac{m_1 - m_2}{1 + m_1 m_2}\right| \geq \theta_{thresh} \end{cases}$$

where $\theta$ is the slope comparison value. The expansion point $(x_{e1}, y_{e1})$, $(x_{e2}, y_{e2})$, or $(x_e, y_e)$ provides the new trim codes that may be implemented by circuit to be calibrated 102 (e.g., $x_e$ being the trim code for the first component and $y_e$ being the trim code for the second component). The test circuit 100 then repeats the process of generating another actual output 108, generating another error signal, determining whether the new trim codes are the calibrated trim codes, and if the new trim codes are not the calibrated trim codes, arranging the error signals from best to worst or worst to best. Transformation logic 206 may continue to expand the newly created points until either a determination is made that the trim codes are the calibrated trim codes or that the newly created point does not correspond to the best error signal.

If the reflected point $(x_r, y_r)$ or expansion point $(x_e, y_e)$ corresponds to trim codes that produce the worst error signal of all previous error signals, such that $f(x_1, y_1) < f(x_2, y_2) < f(x_3, y_3) < f(x_r, y_r)$, then the reflection produced trim codes that produces an actual output 106 further from the expected output 108. Thus, in an embodiment, the transformation logic 206 may contract the worst point prior to the reflection (e.g., $(x_3, y_3)$) toward the centroid. For example, the contraction point where the vertex with the worst error signal (e.g., $(x_3, y_3)$) is contracted may be determined as follows:

$$(x_c, y_c) = x_0 + \rho(x_0 - x_3)$$

where $(x_c, y_c)$ is the point where the vertex is to be contracted toward the centroid, $x_0$ is the x-coordinate of the centroid, $y_0$ is the y-coordinate of the centroid, and ρ is a multiplication factor of the contraction (in some embodiments ρ=−½). If the contraction point ($x_c$, $y_c$) provides a point better than the worst point, the contraction point ($x_c$, $y_c$) replaces the worst point ($x_3$, $y_3$) and provides the new point that ordering logic arranges from best to worst or worst to best. For example, the contraction point ($x_c$, $y_c$) provides the new trim codes that may be implemented by circuit to be calibrated 102 (e.g., $x_c$ being the trim code for the first component and $y_c$ being the trim code for the second component). The test circuit 100 then repeats the process of generating another actual output 108, generating another error signal, determining whether the new trim codes are the calibrated trim codes, and if the new trim codes are not the calibrated trim codes, arranging the error signals from best to worst or worst to best.

If the contraction point ($x_c$, $y_c$) corresponds to trim codes that produce the worst error signal (e.g., the error signal generated by the trim codes produced by the contraction point is arranged as follows: $f(x_1, y_1) < f(x_2, y_2) < f(x_3, y_3) < f(x_c, y_c)$), in an embodiment, the transformation logic 206 may iteratively reduce the non-best points towards the point corresponding with the best error value. Continuing this example, the ($x_2$, $y_2$) point and ($x_3$, $y_3$) may be moved towards the ($x_1$, $y_1$) point that corresponding to the best error signal as follows:

$$(x_d, y_d) = x_1 + \sigma(x_i - x_1) \text{ for all } i \in \{2, \ldots, n+1\}$$

where ($x_d$, $y_d$) are the points where the vertex is to be contracted toward the centroid, $x_1$ is the x-coordinate of the vertex corresponding to the best error value, $x_i$ is the x-coordinate of all of the other vertices, and a is a multiplication factor of the reduction (in some embodiments σ=½). The reduced points ($x_d$, $y_d$) provide the new trim codes that may be implemented by circuit to be calibrated 102 (e.g., $x_d$ being the trim code for the first component and $y_d$ being the trim code for the second component). The test circuit 100 then repeats the process of generating another actual output 108, generating another error signal, determining whether the new trim codes are the calibrated trim codes, and if the new trim codes are not the calibrated trim codes, arranging the error signals from best to worst or worst to best.

The transformation logic 206 continues to reflect, expand, contract, and/or reduce the points of the simplex structure until the error value becomes less than the threshold value, thus, revealing the calibrated trim codes. While the reflection, expansion, contraction, and reduction process has been described in a specific order, in alternative embodiments, the transformation logic 206 may perform any of reflection, expansion, contraction, and reduction in any order.

Figure 4:
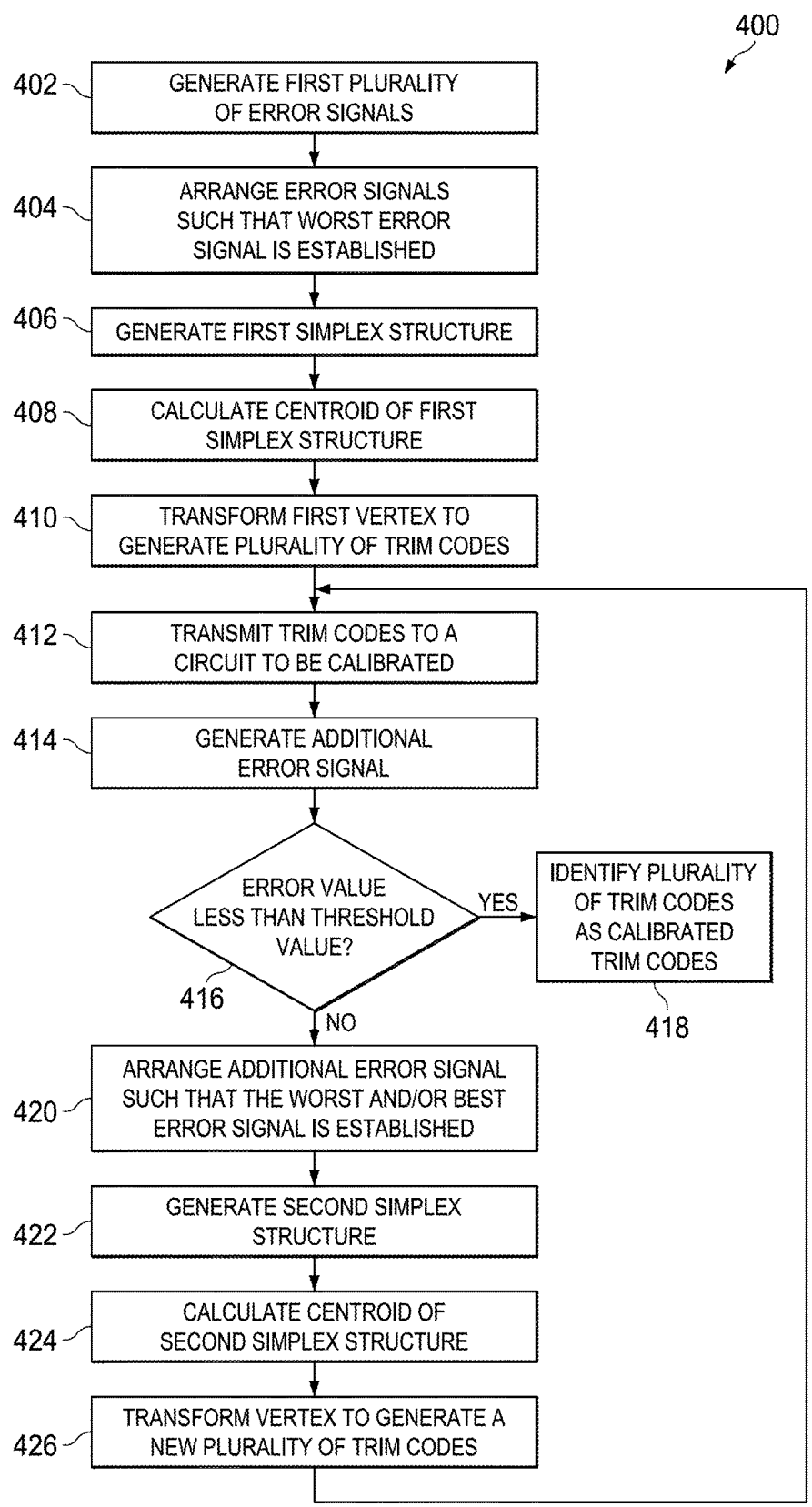
FIG. 4 shows a flow diagram of a method for calibrating a circuit in accordance with various embodiments.
Figure 5:
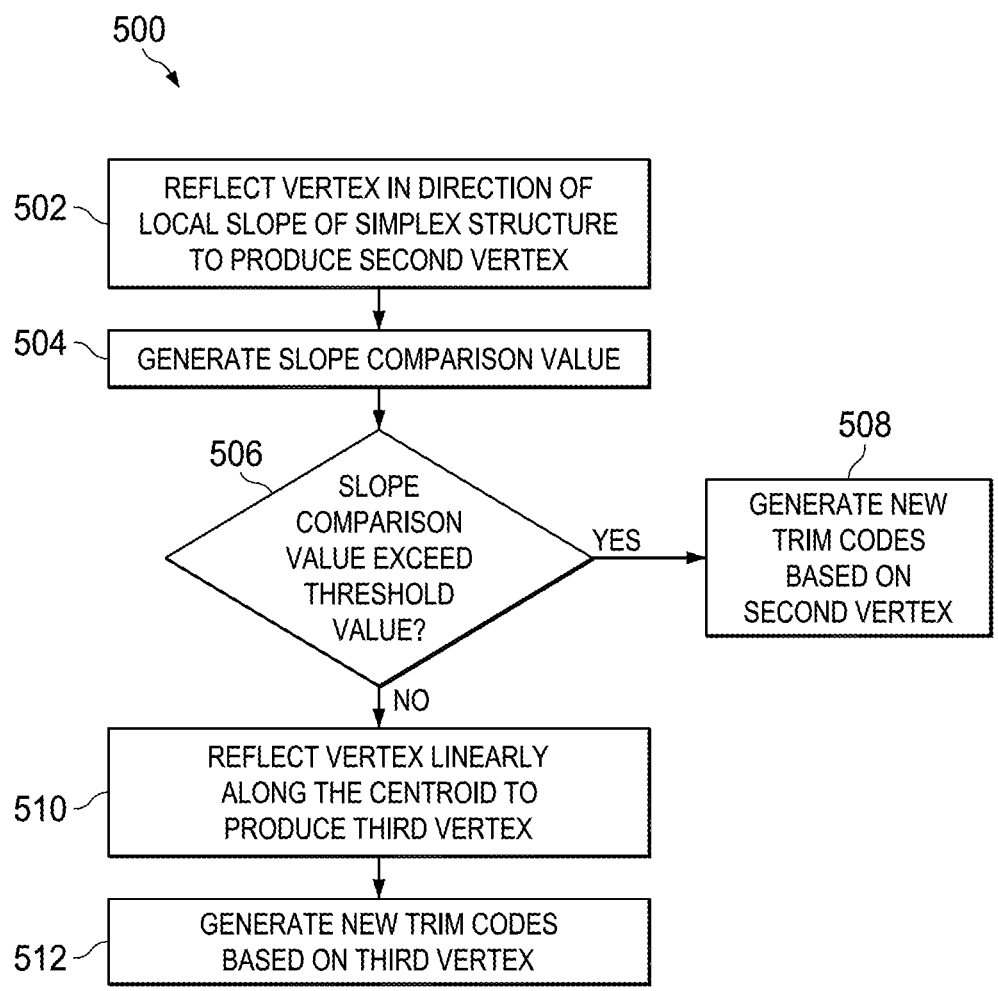
FIG. 5 shows a flow diagram of a method for transforming a vertex in accordance with various embodiments.

FIG. 4 shows a flow diagram of a method 400 for calibrating a circuit, such as circuit to be calibrated 102, in accordance with various embodiments. FIG. 5 shows a flow diagram of a method 500 for transforming a vertex in accordance with various embodiments. Though depicted sequentially as a matter of convenience, at least some of the actions shown in methods 400 and 500 can be performed in a different order and/or performed in parallel. Additionally, some embodiments may perform only some of the actions shown or may perform additional actions. In some embodiments, at least some of the operations of the methods 400 and 500, as well as other operations described herein, can be performed by circuit to be calibrated 102, error generation circuit 110, and/or simplex circuit 112 implemented by a processor executing instructions stored in a non-transitory computer readable storage medium or a state machine.

The method 400 begins in block 402 with generating a first plurality of error signals. In an embodiment, error generation circuit 110 may generate the error signals by determining one or more differences between an expected output, such as expected output 108, and an actual output, such as actual output 106, from a circuit to be calibrated, such as circuit to be calibrated 102, undergoing calibration to determine an error value. The actual output may be generated through the implementation of trim codes, such as trim codes 122-126 of trim code family 120 by the circuit to be calibrated. In some embodiments, the first plurality of error signals comprises three error signals created by the three actual outputs generated by the circuit to be calibrated implementing three different trim code families. In block 404, the method 400 continues with arranging the error signals such that the worst error signal (i.e., error signal where the error value is the greatest) is established. In some embodiments, the error signals may be arranged from best (i.e., error signal where the error value is the least) to worst or from worst to best. The simplex circuit 112 may arrange the error signals.

The method 400 continues in block 406 with generating, in some embodiments by simplex circuit 112, a first simplex structure. The first simplex structure may be generated utilizing trim code values that were implemented by the circuit to be calibrated, such as circuit to be calibrated 102, to generate the actual output, such as actual output 106, which was utilized to generate the error signals as the coordinates of the vertices of the simplex structure. For example, the trim codes of a single trim code family, such as trim code family 120, may comprise the coordinates for one of the vertices of the first simplex structure. More specifically, one trim code of the trim code family may comprise the x-coordinate of a first vertex of the first simplex structure while a second trim code in the trim code family may comprise the y-coordinate of the first vertex of the first simplex structure. The trim codes of additional trim code families may comprise the coordinates of the remaining vertices of the first simplex structure.

In block 408, the method 400 continues with calculating, in some embodiments by simplex circuit 112, a centroid of the first simplex structure minus the vertex corresponding to the worst error signal. Thus, this centroid may comprise the geometric center of the first simplex structure without the vertex corresponding to the worst error signal. The method 400 continues in block 410 with transforming, in some embodiments by simplex circuit 112, a first vertex of the first simplex structure to generate a plurality of trim codes. The transforming may include reflecting, expanding, contracting, and/or reducing one of the vertices of the first simplex structure. For example, if the error signal corresponding to the first vertex of the first simplex structure is arranged as the worst error signal, then the first vertex may be reflected across the simplex structure. In some embodiments, this reflection may comprise reflecting the first vertex linearly along the centroid. In alternative embodiments, this reflection may comprise reflecting the first vertex in a direction of local slope of the first simplex structure. This transforming determines a new vertex for the simplex structure.

In block 412, the method 400 continues with transmitting, in some embodiments by the simplex circuit 112, additional trim codes to the circuit to be calibrated, such as circuit to be calibrated 102. The new vertex of the simplex structure determined by the transformation in block 410 may include the additional trim codes. For example, the x-coordinate of the new vertex may be one of the additional trim codes while the y-coordinate of the new vertex may be another of the additional trim codes. The circuit to be calibrated 102 then, in some embodiments, may implement the additional trim codes, thereby, generating an additional actual output. The method 400 continues in block 414 with generating, in some embodiments by error generation circuit 110, an additional error signal. After the circuit to be calibrated 102 generates the additional actual output, the error generation circuit 110 may generate an additional error signal based on the differences between the expected output and the additional actual output. These differences may make up the error value that is included in the additional error signal.

In block 416, the method 400 continues with determining, in some embodiments by simplex circuit 412, whether the error value contained in the additional error signal is less than a threshold value. If in block 416 a determination is made that the error value contained in the additional error signal is less than the threshold value, then the method 400 continues in block 418 with identifying, in some embodiments by simplex circuit 112, the additional trim codes (i.e., the trim codes of the last trim code family implemented by the circuit to be calibrated) as the calibrated trim codes. The calibrated trim codes then may be implemented by the calibrated circuit for operation and may be considered optimized.

If, however, in block 416 a determination is made that the error value contained in the additional error signal is not less than the threshold value, then the method 400 continues in block 420 with arranging, in some embodiments by simplex circuit 112, the additional error signal with the previously generated error signals such that the worst error signal and/or best error signal is established. In block 422, the method 400 continues with generating, in some embodiments by simplex circuit 112, a second simplex structure. The second simplex structure may include the vertices of the first simplex structure along with the previously transformed new vertex. The method 400 continues in block 424 with calculating, in some embodiments by simplex circuit 112, the centroid of the second simplex structure. The method 400 continues in block 426 with transforming, in some embodiments by simplex circuit 112, one of the vertices of the second simplex structure to generate a plurality of additional trim codes. The transforming may include reflecting, expanding, contracting, and/or reducing one of the vertices of the first simplex structure. The method 400 then may continue in block 412 with transmitting the additional trim codes to the circuit to be calibrated for implementation.

FIG. 5 shows a flow diagram of a method 500 for transforming a vertex in accordance with various embodiments. The method 500 begins in block 502 with reflecting, in some embodiments by simplex circuit 112, a vertex of a simplex structure in the direction of local slope of the simplex structure to produce a second vertex. In block 504, the method 500 continues with generating a slope comparison value. The slope comparison value may be a relationship between the slope of a line from one of the vertices of the simplex structure to the second vertex and the slope of another of the sides of the new simplex structure.

The method 500 continues in block 506 with a determination, in some embodiments by simplex circuit 112, of whether the slope comparison value is or exceeds a threshold value. If in block 506 a determination is made that the slope comparison value exceeds the threshold value, then the method 500 continues in block 508 with generating, in some embodiments by simplex circuit 112, new trim codes based on the second vertex (e.g., the coordinates of the second vertex are the new trim codes). However, if in block 506 a determination is made that the slope comparison value does not exceed the threshold value, then the method 500 continues in block 510 with reflecting, in some embodiments by simplex circuit 112, the original vertex linearly along the centroid to produce a third vertex. In block 512, the method 500 continues with generating, in some embodiments by simplex circuit 112, new trim codes based on the third vertex (e.g., the coordinates of the third vertex are the new trim codes).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A test circuit, comprising:
an error generation circuit configured to:
receive, from a circuit to be tested, a first actual output and a second actual output produced using a first plurality of trim codes;
generate a first error signal based on a difference between the first actual output and a first expected output of the circuit to be calibrated;
generate a second error signal based on a difference between the second actual output and a second expected output of the circuit to be calibrated; and
calculate an error value based on the first error signal, a first weight value for the first error signal, the second error signal, and a second weight value for the second error signal; and
a simplex circuit coupled to the error generation circuit, the simplex circuit configured to:
transmit, to the circuit to be calibrated, the first plurality of trim codes;
receive the error value from the error generation circuit;
simultaneously generate a second plurality of trim codes utilizing a simplex algorithm based on the error value, in response to determining that the error value exceeds an error threshold, wherein the second plurality of trim codes is in a trim code family; and
transmit the second plurality of trim codes to the circuit to be calibrated, after simultaneously generating the second plurality of trim codes.

2. The test circuit of claim 1, wherein:
the error generation circuit is further configured to:
receive, from the circuit to be calibrated, a third actual output; and
generate a third error signal based on a difference between the third actual output and a third expected output; and
the simplex circuit is further configured to receive the third error signal from the error generation circuit, generate a third plurality of trim codes utilizing the simplex algorithm based on the third error signal, and transmit the third plurality of trim codes to the circuit to be calibrated.

3. The test circuit of claim 1, wherein:
the error generation circuit is further configured to:
receive, from the circuit to be calibrated, a plurality of actual outputs corresponding to a plurality of components of the circuit to be calibrated;
assign weight factors to the plurality of actual outputs; and
wherein calculating the error value is based on the weight factors.

4. The test circuit of claim 1, wherein the simplex algorithm causes the simplex circuit to:
generate a first simplex structure comprising a plurality of vertices, a plurality of coordinates of one of the plurality of vertices corresponding to the first plurality of trim codes;
calculate a centroid of the first simplex structure; and
transform a first vertex of the plurality of vertices to generate the second plurality of trim codes.

5. The test circuit of claim 4, wherein the simplex circuit is configured to transform the first vertex by:
reflecting the first vertex in a direction of local slope of the first simplex structure to produce a second vertex;
generating a slope comparison value by comparing a slope of the second vertex with a slope of one side of the first simplex structure;
based on the slope comparison value exceeding a threshold value, generating the second plurality of trim codes based on the second vertex; and
based on the slope comparison value being less than the threshold value:
reflecting the first vertex linearly opposite the centroid of the first simplex structure to produce a third vertex; and
generating the second plurality of trim codes based on the third vertex.

6. The test circuit of claim 4, wherein the first vertex corresponds to an error signal having a worst error value.

7. The test circuit of claim 4, wherein the simplex circuit is configured to transform the first vertex by expanding the first vertex in a direction of local slope of the first simplex structure to produce a second vertex and generating the second plurality of trim codes based on the second vertex.

8. The test circuit of claim 4, wherein the simplex circuit is configured to transform the first vertex by contracting the first vertex toward the centroid to produce a second vertex and generating the second plurality of trim codes based on the second vertex.

9. The test circuit of claim 1, wherein the simplex circuit is further configured to identify the first plurality of trim codes as calibrated trim codes for the circuit to be calibrated in response to determining that the first error signal does not exceed the error threshold.

10. A method comprising:
transmitting, by a simplex circuit to a circuit to be calibrated, a first plurality of trim codes;
receiving, by an error generation circuit from the circuit to be calibrated, a plurality of actual outputs produced using the first plurality of trim codes;
generating, by the error generation circuit, a first plurality of error signals based on differences between a plurality of expected outputs of the circuit to be calibrated and the plurality of actual outputs;
calculating an error value based on the first plurality of error signals and a plurality of weight factors corresponding to the first plurality of error signals; and
performing, by the simplex circuit, a simplex algorithm using the error value, in response to determining that the error value is greater than an error threshold, comprising:
generating a first simplex structure comprising a first plurality of vertices corresponding to the first plurality of trim codes;
calculating a centroid of the first simplex structure;
transforming a first vertex of the first plurality of vertices to simultaneously generate a second plurality of trim codes; and
transmitting the second plurality of trim codes to the circuit to be calibrated.

11. The method of claim 10, further comprising:
generating an additional error signal based on a difference between an expected output from the circuit to be calibrated and an additional actual output of the circuit to be calibrated implementing the second plurality of trim codes; and
generating a second simplex structure comprising a second plurality of vertices corresponding to the first plurality of trim codes and the second plurality of trim codes;
calculating a centroid of the second simplex structure; and
transforming a second vertex of the second plurality of vertices to generate a third plurality of trim codes.

12. The method of claim 11, further comprising:
comparing an error value of the additional error signal to a threshold value; and
based on the error value being less than the threshold value, identifying the second plurality of trim codes as calibrated trim codes for the circuit to be calibrated.

13. The method of claim 10, wherein transforming the first vertex comprises:
reflecting the first vertex in a direction of local slope of the first simplex structure to produce a second vertex;
generating a slope comparison value by comparing a slope of the second vertex with a slope of one side of the first simplex structure;
based on the slope comparison value exceeding a threshold value, generating the second plurality of trim codes based on the second vertex; and
based on the slope comparison value being less than the threshold value:
reflecting the first vertex linearly opposite the centroid of the first simplex structure to produce a third vertex; and
generating the second plurality of trim codes based on the third vertex.

14. The method of claim 10, wherein transforming the first vertex comprises expanding the first vertex in a direction of local slope of the first simplex structure.

15. The method of claim 10, wherein transforming the first vertex comprises contracting the first vertex toward the centroid.

16. A simplex circuit, comprising:
ordering circuitry configured to:
receive a first plurality of error signals;
generate a plurality of error signals based on differences between the plurality of error signals and a plurality of expected outputs from a circuit to be calibrated;
calculate an error value based on the plurality of error signals and a plurality of weight factors corresponding to the plurality of error signals; and
perform a simplex algorithm, in response to determining that the error value is greater than an error threshold, comprising generating a first simplex structure comprising a first plurality of vertices, based on the plurality of error signals;
centroid calculation circuitry configured to identify a centroid of the first simplex structure; and
transformation circuitry configured to:
transmit, to the circuit to be calibrated, a first plurality of trim codes, before the ordering circuitry receives the first plurality of error signals;

reflect, expand, contract, or reduce a first vertex of the first plurality of vertices, to simultaneously generate a second plurality of trim codes; and transmit the second plurality of trim codes to the circuit to be calibrated;

wherein each of the first plurality of vertices corresponds with one of the first plurality of trim codes.

17. The simplex circuit of claim 16, wherein the transformation circuitry is configured to reflect the first vertex linearly opposite the centroid of the first simplex structure.

18. The simplex circuit of claim 16, wherein the transformation circuitry is configured to reflect the first vertex in a direction of local slope of the first simplex structure.

19. The simplex circuit of claim 16, wherein:

the ordering circuitry is further configured to receive an additional error signal generated based on a difference between an expected output from the circuit to be calibrated and an additional actual output from the circuit to be calibrated implementing the second plurality of trim codes and generate a second simplex structure comprising a second plurality of vertices;

the centroid calculation circuitry is further configured to identify a centroid of the second simplex structure; and the transformation circuitry is further configured to reflect, expand, contract, or reduce a second vertex of the second plurality of vertices to generate a third plurality of trim codes and transmit the third plurality of trim codes to the circuit to be calibrated for implementation.

20. The simplex circuit of claim 16, wherein the ordering circuitry is further configured to arrange the first plurality of error signals such that a worst error signal is established and wherein the first vertex corresponds to an error signal of the first plurality of error signals having a worst error value.

* * * * *